US010636626B2

(12) United States Patent
Pandey et al.

(10) Patent No.: US 10,636,626 B2
(45) Date of Patent: Apr. 28, 2020

(54) DOGBONE INLET CONE PROFILE FOR REMOTE PLASMA OXIDATION CHAMBER

(71) Applicant: Applied Materials, Inc., Santa Clara, CA (US)

(72) Inventors: Vishwas Kumar Pandey, Madhya Pradesh (IN); Kartik Shah, Saratoga, CA (US); Christopher S. Olsen, Fremont, CA (US); Agus Sofian Tjandra, Milpitas, CA (US); Hansel Lo, San Jose, CA (US); Eric Kihara Shono, San Mateo, CA (US); Hemantha Raju, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/230,917

(22) Filed: Dec. 21, 2018

(65) Prior Publication Data

US 2019/0228951 A1  Jul. 25, 2019

(30) Foreign Application Priority Data

Jan. 25, 2018  (IN) .............................. 201841003045

(51) Int. Cl.
*C23C 16/50* (2006.01)
*H01J 37/32* (2006.01)
*C23C 16/455* (2006.01)

(52) U.S. Cl.
CPC .. *H01J 37/32357* (2013.01); *C23C 16/45502* (2013.01); *C23C 16/45582* (2013.01)

(58) Field of Classification Search
CPC ......... H01J 37/32357; C23C 16/45582; C23C 16/45502

(Continued)

(56) References Cited

U.S. PATENT DOCUMENTS 9,410,248 B2 * 8/2016 Kools ............... C23C 16/45525
9,695,508 B2 * 7/2017 Carlson ............... C23C 16/4404

(Continued)

FOREIGN PATENT DOCUMENTS

KR    20040093534       11/2004
KR    100660795 B1      12/2006

(Continued)

OTHER PUBLICATIONS

PCT International Search Report/Written Opinion dated Apr. 17, 2019 for Application No. PCT/US2018/067479.

*Primary Examiner* — Rudy Zervigon
(74) *Attorney, Agent, or Firm* — Patterson + Sheridan LLP

(57) ABSTRACT

Embodiments of the present disclosure generally relate to a processing chamber for conformal oxidation of high aspect ratio structures. The processing chamber includes a chamber body with a first side and a second side opposite the first side, and a flow assembly disposed in the first side. The flow assembly includes a flow divider to direct fluid flow away from a center of a substrate disposed in a processing region of the processing chamber. The flow divider includes a crescent shaped first side, a top, and a bottom. The processing chamber also includes a distributed pumping structure located adjacent to the second side. The flow assembly is designed to reduce flow constriction of the radicals, leading to increased radical concentration and flux.

13 Claims, 6 Drawing Sheets

(58) Field of Classification Search
USPC .................................. 118/715; 156/345.1
See application file for complete search history.

(56) References Cited

U.S. PATENT DOCUMENTS

| | | |
|---|---|---|
| 2004/0216844 A1 | 11/2004 | Janakiraman et al. |
| 2005/0221618 A1 | 10/2005 | AmRhein et al. |
| 2007/0207275 A1 | 9/2007 | Nowak et al. |
| 2009/0017227 A1 | 1/2009 | Fu et al. |
| 2009/0283039 A1 | 11/2009 | White et al. |
| 2013/0012030 A1 | 1/2013 | Lakshmanan et al. |

FOREIGN PATENT DOCUMENTS

| | | |
|---|---|---|
| KR | 20100121984 A | 11/2010 |
| WO | 2016190007 A1 | 12/2016 |

\* cited by examiner

US 10,636,626 B2

DOGBONE INLET CONE PROFILE FOR REMOTE PLASMA OXIDATION CHAMBER

CROSS-REFERENCE TO RELATED APPLICATION

This application claims priority to Indian Provisional Patent Application No. 201841003045, filed on Jan. 25, 2018, which is herein incorporated by reference.

BACKGROUND

Field

Embodiments of the present disclosure generally relate to semiconductor device fabrication and in particular to a flow assembly for conformal oxidation of high aspect ratio structures.

Description of the Related Art

The production of silicon integrated circuits has placed difficult demands on fabrication steps to increase the number of devices while decreasing the minimum feature sizes on a chip. Additionally, increased cost pressure on device fabricators creates the need to increase throughput at semiconductor manufacturing facilities. As a result, semiconductor manufacturing processes must perform film formation and modification operations at high speed with extreme uniformity. One such process is the oxidation of a film on a semiconductor substrate. In such a process, an oxidation gas mixture flows into a processing chamber at a high velocity and modifies an underlying layer of a substrate by incorporation of oxygen therein to form an oxide of the film. The speed at which the gas enters the processing chamber and short residence time within the chamber before being exhausted does not allow time for the gas to spread evenly across the substrate, and non-uniform film thickness results.

Therefore, an improved apparatus and method for performing oxidation of a semiconductor substrate is needed.

SUMMARY

Embodiments of the present disclosure generally relate to semiconductor device fabrication and in particular to a flow assembly for conformal oxidation of high aspect ratio structures. In one or more embodiments, a processing chamber is disclosed. The processing chamber includes a chamber body with a first side and a second side opposite the first side, and a flow assembly disposed in the first side. The flow assembly includes a flow divider. The flow divider includes a crescent shaped first side, a top, and a bottom. The processing chamber also includes a distributed pumping structure located adjacent to the second side.

In other embodiments, a processing system includes a precursor activator, and a processing chamber coupled to the precursor activator. The processing chamber includes a chamber body with a first side and a second side opposite the first side, and a flow assembly disposed in the first side. The flow assembly includes a flow divider. The flow divider includes a crescent shaped first side, a top, and a bottom. The processing chamber also includes a distributed pumping structure adjacent to the second side.

In other embodiments, a flow assembly is disclosed. The flow assembly includes a first side, a second side opposite the first side, a channel disposed between the first side and the second side, and a flow divider disposed within the channel. The first side includes a recess and a first opening within the recess. The second side is curved and includes a second opening. The flow divider includes a first crescent shaped side, a top, and a bottom.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to semiconductor device fabrication and in particular to a liner and a flow assembly for a processing chamber in which a conformal oxidation operation is performed. The processing chamber includes a chamber body with spaced apart first side and second sides, and a flow assembly located in a fluid conduit extending through the first side of the chamber body. The flow assembly includes a flow divider to adjust the flow profile of a fluid flowing through the conduit to reduce the volume of fluid flowing in a central area of the conduit and increase the volume flowing in peripheral areas of the conduit. The flow divider reduces a cross-sectional area of the conduit in the central area thereof, directing increased gas flow to the periphery of the conduit. The flow divider thus increases rate of spreading of the gas across the substrate as the gas flows across the substrate in the processing chamber, improving uniformity of the oxide film formed on the substrate.

The processing chamber also includes a distributed pumping structure located adjacent to the second side of the chamber. The distributed pumping structure is used to adjust gas flow in the processing chamber to improve film thickness uniformity.

The flow divider is part of a flow assembly disposed in the gas flow conduit. The flow assembly includes a liner made of a material such as quartz, ceramic, or silica that does not react with reactive gas species and minimizes opportunities for such gas species to deactivate while flowing to the substrate. The flow assembly is designed to reduce flow constriction of the radicals, leading to increased radical concentration and flux. The two pumping ports can be individually controlled to tune the flow of the radicals through the processing region of the processing chamber. By reducing the height of the flow pathway in the central area of the flow assembly, gas flow can be spread towards the edge of the substrate providing for improved deposition uniformity.

Figure 1A:
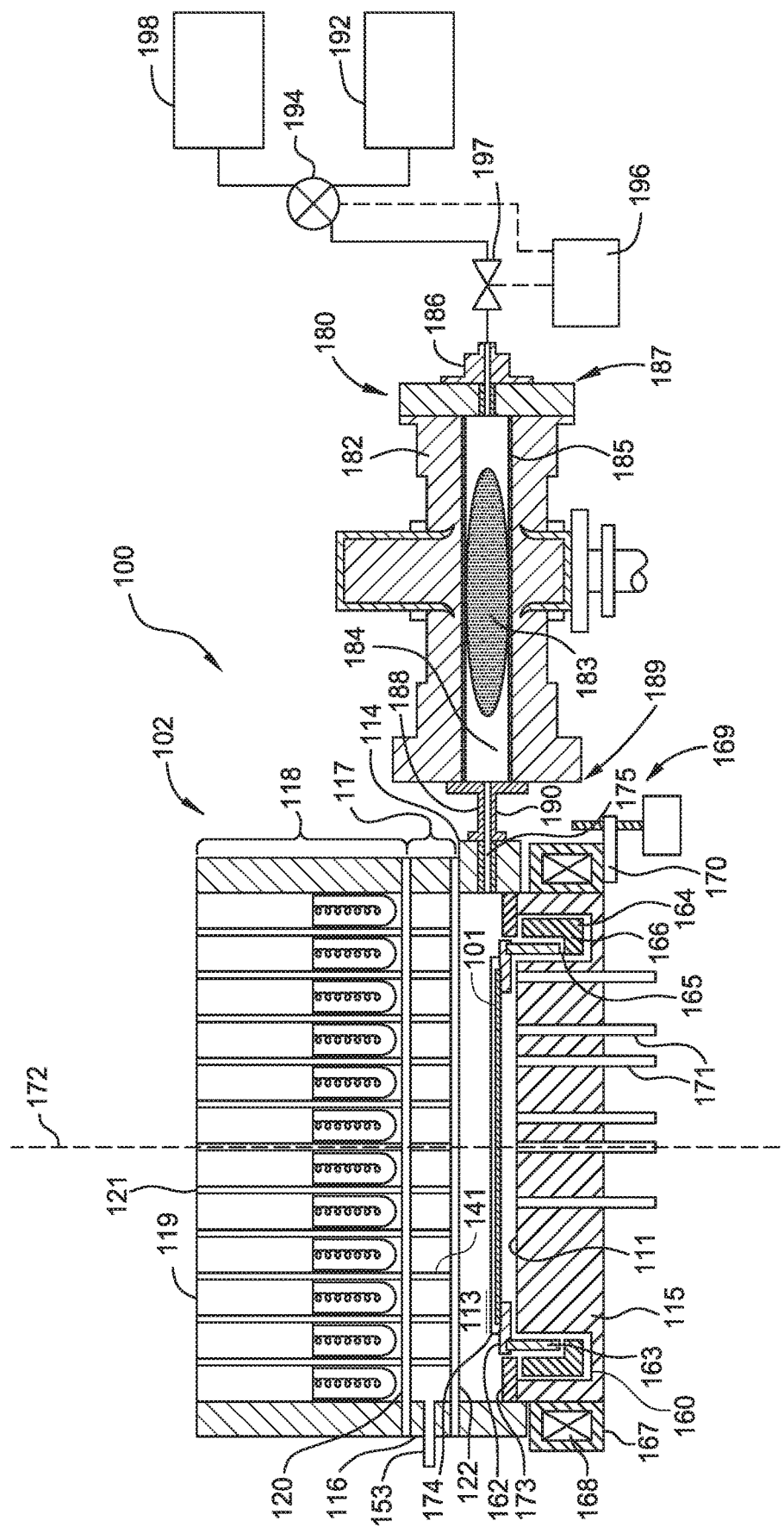
FIG. 1A is a schematic of a processing system, according to one or more embodiments described and discussed herein.

FIG. 1A illustrates a substrate processing system 100 that includes a thermal processing chamber 102 and a precursor activator 180 that couples to the thermal processing chamber 102. In one aspect, the precursor activator is a plasma generator located remotely from the processing region 113 of the thermal processing chamber 102 on a flowline used to introduce one or more process gases to the processing region 113, whereby a plasma is formed of the gas passing through the activator ionizing at least a portion of the gas species passing therethrough. Because the energy supporting the gas in a plasma state exists only in the precursor activator 180, the precursor gas enters the processing volume of the chamber in an activated, yet non-plasma state, including therein a high percentage of radical species of the precursor gas, here an activated gas mixture. The precursor activator 180 can also be used to provide an activated gas mixture without using a plasma, for example by applying energy to a gas, which energy does not significantly ionize the gas. The thermal processing chamber 102 has a processing region 113 into which the activated precursor gas is introduced, and which is enclosed by one or more side walls 114 (e.g., four side walls) and a base 115. The upper portion of side wall 114 may be sealed to a window assembly 117 (e.g., using "O" rings). Here, a radiant energy assembly 118 is positioned over and coupled to window assembly 117. The radiant energy assembly 118 has a plurality of lamps 119, which may be tungsten halogen lamps, each mounted into a receptacle 121 and positioned to emit electromagnetic radiation into the processing region 113. The window assembly 117 of FIG. 1A has a plurality of light pipes 141 (e.g., short light pipes), but the window assembly 117 may just have a flat, solid window with no light pipes therein. The window assembly 117 has an outer wall 116 (e.g., a cylindrical outer wall) that forms a rim enclosing the window assembly 117 around a circumference thereof. The window assembly 117 also has a first window 120 covering a first end of the light pipes 141 and a second window 122 covering a second end of the light pipes 141, opposite the first end. The first window 120 and second window 122 extend to, and engage with, the outer wall 116 of the window assembly 117 to enclose and seal the interior of the window assembly 117, which includes the light pipes 141. In such cases, when light pipes are used, a vacuum can be produced in the plurality of light pipes 141 by applying vacuum through a conduit 153 through the outer wall 116 to one of the light pipes 141, which is in turn fluidly connected to the rest of the pipes.

A substrate 101 is supported in the thermal processing chamber 102, here by a support ring 162 within the processing region 113. The support ring 162 is mounted on the top of a rotatable cylinder 163. By rotating the rotatable cylinder 163, the support ring 162 and substrate 101 are caused to rotate during processing. The base 115 of the thermal processing chamber 102 has a reflective surface 111 for reflecting energy onto the backside of the substrate 101 during processing. Alternatively, a separate reflector (not shown) can be positioned between the base 115 of the thermal processing chamber 102 and the support ring 162. The thermal processing chamber 102 may include a plurality of temperature probes 171 disposed through the base 115 of the thermal processing chamber 102 to detect the temperature of the substrate 101. In the event a separate reflector is used, as described above, the temperature probes 171 are also extends through the separate reflector for optical access to electromagnetic radiation coming from the substrate 101.

The rotatable cylinder 163 is supported by a magnetic rotor 164, which is a cylindrical member having a ledge 165 on which the rotatable cylinder 163 rests when both members are installed in the thermal processing chamber 102. The magnetic rotor 164 has a plurality of magnets in a magnet region 166 below the ledge 165. The magnetic rotor 164 is disposed in an annular well 160 located at a peripheral region of the thermal processing chamber 102 along the base 115. A cover 173 rests on a peripheral portion of the base 115 and extends over the annular well 160 toward the rotatable cylinder 163 and support ring 162, leaving a tolerance gap between the cover 173 and the rotatable cylinder 163 and/or the support ring 162. The cover 173 generally protects the magnetic rotor 164 from exposure to process conditions in the processing region 113.

The magnetic rotor 164 is rotated by coupling to a rotating magnetic field from a magnetic stator 167 disposed around the base 115. The magnetic stator 167 has a plurality of electromagnets 168 that, during processing of the substrate 101, are powered according to a rotating pattern to form a rotating magnetic field that provides a rotating magnetic field which couples to the magnets in the magnetic rotor 164 to cause the magnetic rotor 164 to rotate. The magnetic stator 167 is coupled to a linear actuator 169, which in this case is a screw-drive, by a support 170. Turning the linear actuator 169 mechanically moves the magnetic stator 167 along an axis 172 of the thermal processing chamber 102, which in turn moves the magnetic rotor 164, the rotatable cylinder 163, the support ring 162, and the substrate 101 along the axis 172.

Processing gas is provided to the processing region 113 of the thermal processing chamber 102 through a chamber inlet 175, and is exhausted from the processing region 113 through a chamber outlet oriented out of the page of FIG. 1A and generally along the same plane as the chamber inlet 175 and the support ring 162 (not shown in FIG. 1A). Substrates enter and exit the thermal processing chamber 102 through an access port 174 formed in the side wall 114 and shown at the rear in FIG. 1A.

The precursor activator 180 has a body 182 surrounding an interior space 184 where a plasma 183 of ions, radicals, and electrons can be formed by application of plasma formation energy. A liner 185 made of quartz or sapphire protects the body 182 from chemical attack by the plasma. The interior space 184 preferably does not have any electrical potential gradient present. A gas inlet 186 is disposed at a first end 187 of the body 182 and opposite from a gas outlet 188 that is located at a second end 189 of the body 182. When the precursor activator 180 is coupled to the thermal processing chamber 102, the gas outlet 188 is in fluid communication with the thermal processing chamber 102 through a delivery line 190 to chamber inlet 175, such that radicals of the activated precursor mixture within the plasma 183 generated within the interior space 184 are supplied to the processing region 113 of the thermal processing chamber 102. The gas outlet 188 may have a diameter greater than the diameter of the gas inlet 186 to allow the excited radicals to be efficiently discharged at a desired flow rate, and to minimize the contact between the radicals and the liner 185. If desired, a separate orifice may be inserted within the liner 185 at the gas outlet 188 to reduce an inner dimension of the interior space 184 at the gas outlet 188. The diameter of the gas outlet 188 (or orifice, if used) can be selected to provide a pressure differential between the processing region 113 and the precursor activator 180. The pressure differential may be selected to yield a composition of radicals and molecules flowing in to the thermal processing chamber 102 that is suitable for processes being performed in the thermal processing chamber 102.

To provide gas for plasma processing in the processing region 113, one or more gas sources 192 is coupled to the gas inlet 186 of the precursor activator 180 through a first input of a three-way valve 194 and a valve 197 used to control the flow rate of gas released from the gas source 192. A second input of the three-way valve 194 may be coupled to a second gas source 198. Each of the first and second gas sources 192 and 198 may be, or include, one or more of a nitrogen-containing gas, an oxygen-containing gas, a silicon-containing gas, or a gas such as argon or helium. A valve controller 196 is connected to the three-way valve 194 to switch the valve between its different positions, depending upon which process is to be carried out. The valve controller 196 also controls switching of the three-way valve 194.

The precursor activator 180 is coupled to an energy source (not shown) to provide an excitation energy, such as an energy having a microwave or RF frequency, to the precursor activator 180 to activate the process gas traveling from the gas source 192 into the activated precursor mixture within the plasma 183. In the case where nitrogen-containing gas, for example, $N_2$, is used, the activation in precursor activator 180 produces N* radicals, positively charged ions such as $N^+$ and $N_2^+$, and electrons in the interior space 184. By locating the precursor activator 180 remotely from the processing region 113 of the thermal processing chamber 102, exposure of the substrate to ions can be minimized. Ions can damage sensitive structures on a semiconductor substrate, whereas radicals are more highly reactive than non-radical molecules of the same gas, and are used to perform beneficial chemical reactions. Use of a precursor activator such as the precursor activator 180 provides for exposure of the substrate 101 to radicals and minimizes exposure of the substrate 101 to ions.

Figure 1B:
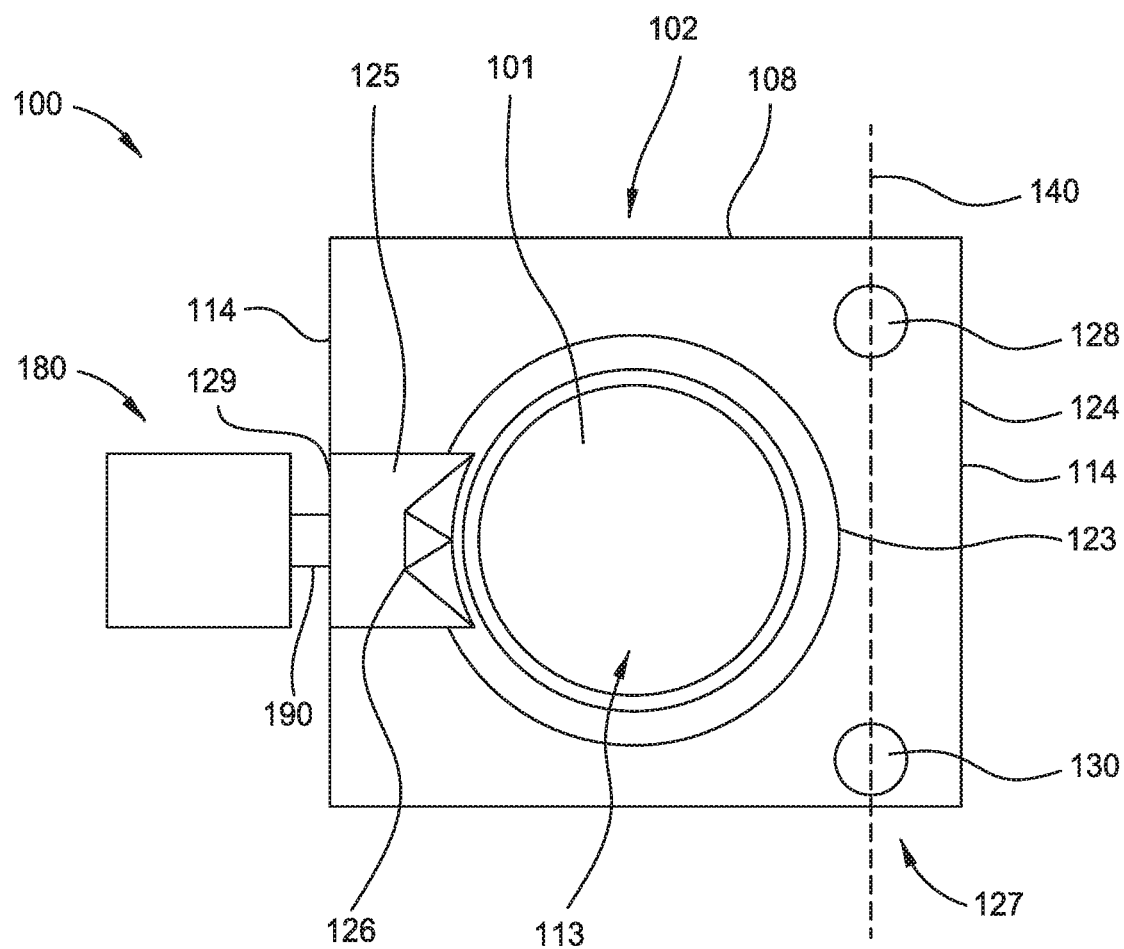
FIG. 1B is a schematic top view of a portion of the processing system illustrated in FIG. 1A, according to one or more embodiments described and discussed herein.

FIG. 1B is a schematic top view of a portion of the substrate processing system 100 according to embodiments described herein. The substrate processing system 100 includes the thermal processing chamber 102 and the precursor activator 180, omitted for clarity is the window assembly 117. The precursor activator 180 may be any suitable precursor activator, such as a microwave coupled plasma source, that operates at a power, for example, of about 6 kW. The precursor activator 180 is coupled to the thermal processing chamber 102 to flow gas formed in the precursor activator 180 toward the thermal processing chamber 102. The precursor activator 180 is coupled to the thermal processing chamber 102 via the delivery line 190. As the gas reaches the plasma generation region, the gas is excited to form a plasma. Downstream from the plasma generation region gas neutrals, gas ions, and gas radicals flow from the plasma generation region towards the exhaust. Gas radicals formed in the precursor activator 180, and gas neutrals flow through the delivery line 190 into the thermal processing chamber 102 during processing of the substrate 101.

The chamber body 108 has an exterior surface, such as the side wall 114, and an interior surface 123. The interior surface 123, in part, defines the processing region 113, in which the substrate 101 is disposed for processing. The interior surface 123 may have a shape similar to the shape of the substrate 101 being processed in the thermal processing chamber 102, in this case circular. The exterior profile 124 may be rectangular, square, or other suitable shape. In one or more embodiments, the chamber body 108 includes a fluid flow body that provides the interior surface 123.

The thermal processing chamber 102 has a distributed pumping structure 127 to remove process gases from the thermal processing chamber 102. Here, two pumping ports 128, 130 are provided adjacent to the second side or side wall 114 of the chamber body 108 to adjust the flow of radicals from a flow assembly 125 to the pumping ports. The two pumping ports 128, 130 are spaced from each other along a line 140 perpendicular to the gas flow path direction at the side wall 114 of the chamber body 108. In other embodiments, the line 140 is not perpendicular to the gas flow path direction, and the line 140 may form an acute or obtuse angle with respect to the gas flow path direction. Other embodiments can have two, or more pumping ports, that are not arranged along a line but may be distributed in a region near the second side or side wall 114 to provide a distributed pumping structure.

The flow assembly 125 is disposed in the chamber inlet 175 (e.g., a gas flow conduit) extending through the side wall 114 of the chamber body 108, from the exterior surface or side wall 114 to the interior surface 123, for radicals to flow from the precursor activator 180 to the processing region 113 of the thermal processing chamber 102. The flow assembly 125 is fabricated from a material such as quartz or silica, in order to reduce interaction with process gases, such as oxygen radicals. In embodiments for use with nitrogen radicals, the flow assembly 125 can be made from nitridation resistant material, such as silicon nitride. The flow assembly 125 is designed to reduce flow constriction of radical flowing to the thermal processing chamber 102. The flow assembly 125 includes a flow divider 126 to adjust fluid flow from the central area of the conduit 129 toward the periphery thereof.

Without the flow divider 126, gas flows from the conduit 129 into the processing region 113, spreading into the processing region 113 under the influence of pressure gradients in the gas column exiting the conduit 129. However, the flow rate of the gas does not provide enough time for the pressure gradients in the gas column to spread gas flow to substantially cover edge portions of the substrate 101. Thus, without the flow divider 126, or a similar structure of the flow assembly 125, the oxide layer formed on the substrate 101 has a non-uniform thickness, such that the oxide layer at the center of the substrate can be up to 40 percent thicker than the oxide layer at the edge of the substrate. By utilizing the flow divider 126 to spread gas flow to substantially cover edge portions of the substrate, the oxide layer formed on the substrate can have an improved thickness uniformity of five percent or less.

Figure 2A:
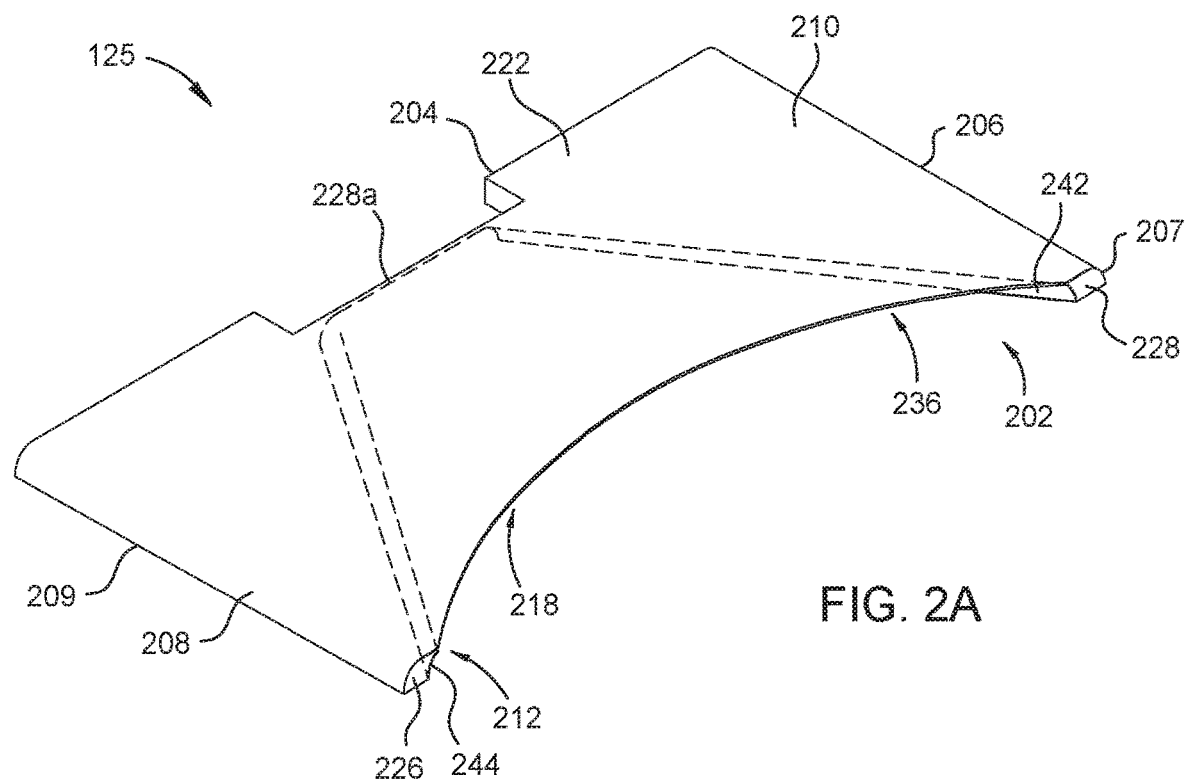
FIG. 2A is a perspective view of a first piece of a flow assembly, according to one or more embodiments described and discussed herein.
Figure 2B:
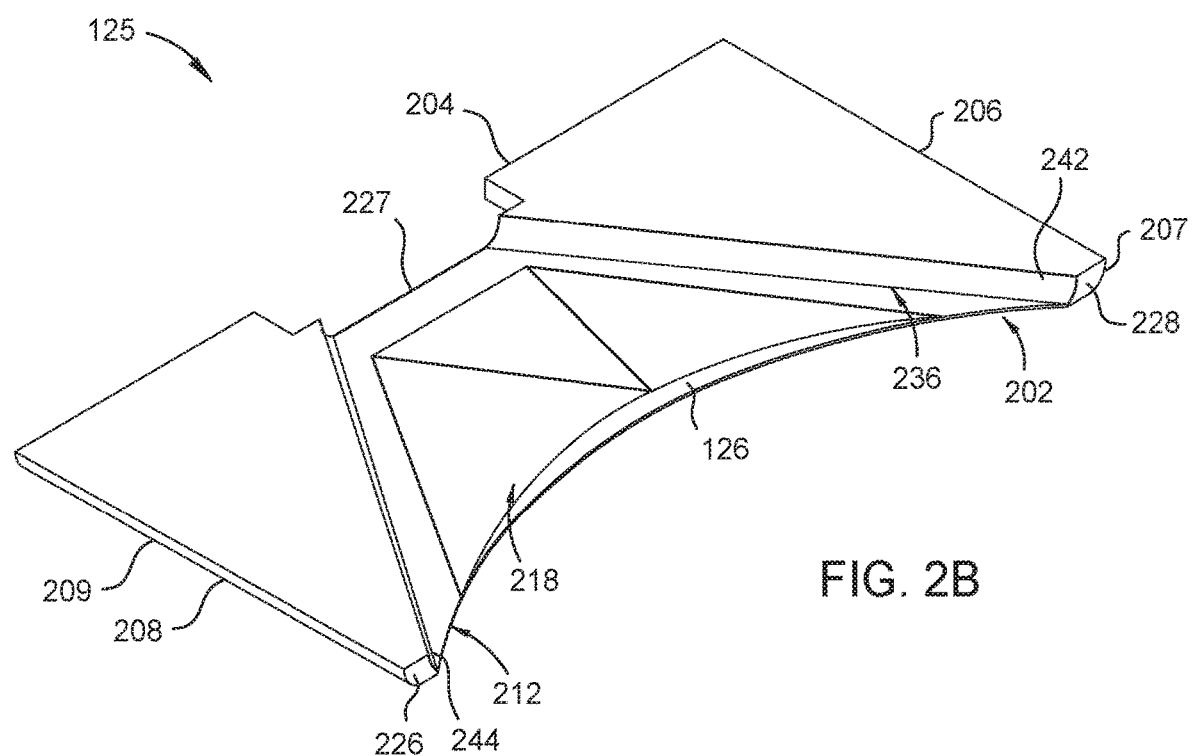
FIG. 2B is a perspective view of a second piece of the flow assembly of FIG. 2A.
Figure 2C:
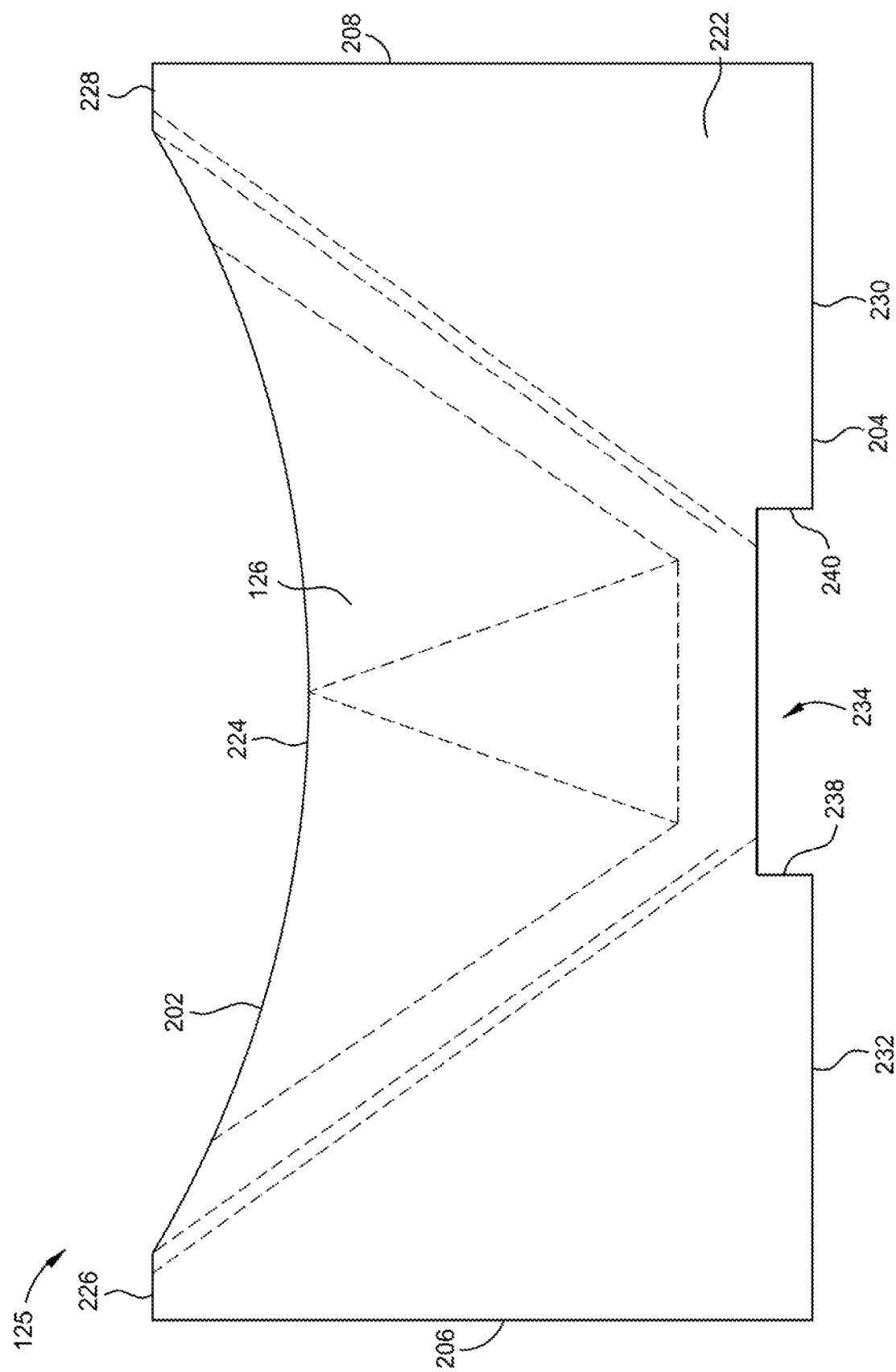
FIG. 2C is a schematic top view of the flow assembly of FIG. 2A, according to one or more embodiments described and discussed herein.
Figure 2D:
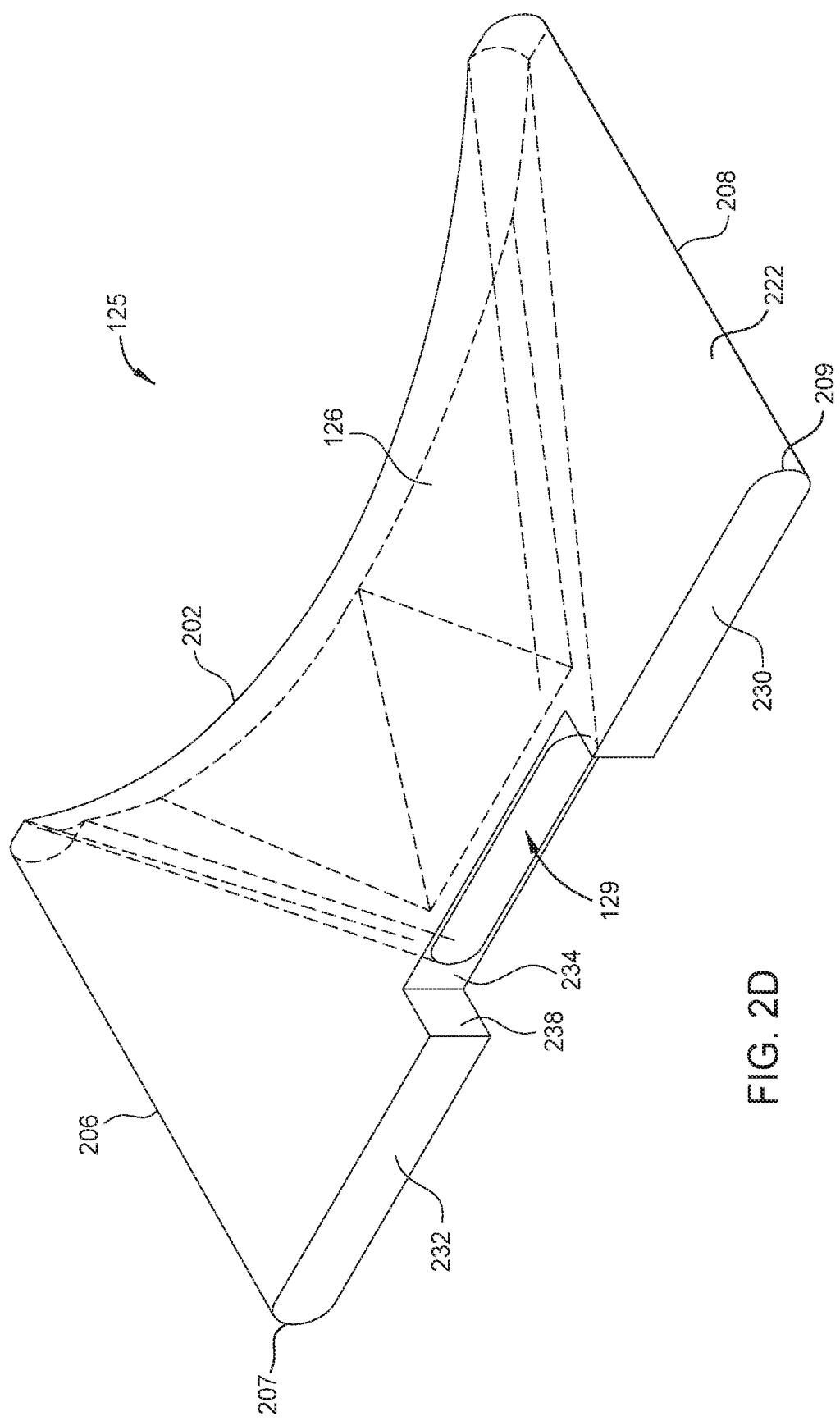
FIG. 2D is front view of the flow assembly of FIG. 2A, according to one or more embodiments described and discussed herein.

FIGS. 2A-2D show perspective views of the flow assembly 125. FIGS. 2A and 2B show two pieces of the flow assembly 125 with an outlet side thereof visible. FIG. 2A is a perspective view of the lower liner of the flow assembly 125 according to embodiments described herein. FIG. 2B is a perspective view of the upper liner of the flow assembly 125 according to embodiments described herein. FIG. 2C is a schematic top view of the flow assembly 125. FIG. 2D shows the flow assembly 125 with an inlet side, opposite from the outlet side, thereof visible.

The flow assembly 125 includes a flow member 222 with an interior space 131 that houses the flow divider 126. The flow member 222 includes the lower liner and the upper liner of the flow assembly 125. In one or more embodiments, the flow member 222 has a rectangular external shape with curved edges 207, 209. The flow member 222 includes an outlet side 202 opposite an inlet side 204, a first peripheral side 206 orthogonal to the outlet side 202 and the inlet side 204, a second peripheral side 208 opposite the first peripheral side 206, a bottom 210 opposite a top 212, and an interior channel 236.

The first peripheral side 206 and the second peripheral side 208 are curved, with a cylindrical curvature around each of the peripheral sides 206, 208 from the top 212 to the bottom 210. The first peripheral side 206 has the curved edge 207 and the second peripheral side 208 has the curved edge 209. The curvature of the first and second peripheral sides 206, 208 of the flow member 222 facilitate fitting the flow member into the conduit 129, which has radiuses sides. The inlet side 204 includes a recess 234. The inlet side 204 has a first portion 230 (FIG. 2C), a second portion 232, and the recess 234 is formed in the inlet side 204 at about the center of the inlet side 204 between the peripheral sides 206, 208. Thus, in some of the embodiments depicted in FIGS. 2A-2D, the first and second portions 230 and 232 are about the same length measured from the first peripheral side 206 to the second peripheral side 208. In other embodiments, the first and second portions 230 and 232 can have different lengths, with the first portion 230 longer than the second portion 232, or the second portion 232 longer than the first portion 230. The recess 234 includes side walls 238, 240 that intersect the second and first portions 232 and 230, respectively. The side wall 238 is orthogonal to and between both the recess 234 and the second portion 232. The side wall 240 is orthogonal to and between both the recess 234 and the first portion 230.

The recess 234 includes an inlet 227. The inlet 227 may be any shape including oval, circular, oblong, square, rectangular, or any other geometric shape. The inlet 227 provides fluid connection from the delivery line 190 into the interior channel 236 of the flow assembly 125.

The outlet side 202 of the flow assembly 125 faces the processing region 113 when installed in opening at delivery line 190. The outlet side 202 includes an outlet 218. As seen in the top view of FIG. 2C, the outlet side 202 includes a concave curved portion 224 between two flat portions, a first flat portion 226 and a second flat portion 228, wherein each of the flat portions 226 and 228 is adjacent to a peripheral side of the flow assembly 125. In this case, the first flat portion 226 is adjacent to the first peripheral side 206 and the second flat portion 228 is adjacent to the second peripheral side 208. The concave curved portion 224 has a length that is greater than the length of either the first flat portion 226 or the second flat portion 228. In one or more examples, a length of the first flat portion 226 in a direction from the first peripheral side 206 to the concave curved portion 224 is the same as a length of the second flat portion 228 from the second peripheral side 208 to the concave curved portion 224. In other examples, a length of the first flat portion 226 in a direction from the first peripheral side 206 to the concave curved portion 224 is not the same as a length of the second flat portion 228 from the second peripheral side 208 to the concave curved portion 224.

The outlet 218 is formed in the concave curved portion 224 and fluidly connects the processing region 113 with the interior channel 236. The outlet 218 has a lateral dimension that is greater than a corresponding lateral dimension of the inlet 227. The outlet 218 also has larger cross-sectional area than the inlet 227. The interior channel 236 extends from the inlet 227 to the outlet 218 through the flow assembly 125. The interior channel 236 has an internal surface with a cross-sectional shape that transitions from the inlet 227 to the outlet 218, providing an expanding flow pathway. Here, the interior channel 236 expands laterally, but in other embodiments the interior channel 236 may also expand in height.

The interior channel 236 is defined in part by the inner surfaces of the top 212 and the bottom 210, and two interior channel walls 242, 244. In one or more embodiments, the interior channel walls 242, 244 are curved and extend from the inlet side 204 to the outlet side 202. The end of the interior channel wall 242 at the outlet side 202 of the flow assembly 125 is closer to the first peripheral side 206 than the end of the interior channel wall 242 at the inlet side 204. Thus the interior channel wall 242 recedes from the inlet 227 to the outlet 218. Likewise, the end of the interior channel wall 244 at the outlet side 202 is closer to the second peripheral side 208 than the end of the interior channel wall 244 at the inlet side 204, so the interior channel wall 244. The interior channel 236 expands toward the peripheral sides 206 and 208 along the flow pathway from the inlet side 204 to the outlet side 202 of the flow assembly 125.

In one or more embodiments, the flow divider 126 is disposed in the interior channel 236 with a flat side of the flow divider 126 abutting the bottom 210 of the flow member 222. In other embodiments, the flow divider 126 is disposed in the interior channel 236 with the flat side abutting the top 212 of the flow member 222. In some embodiments, the flow divider 126 is disposed in the interior channel 236 along each of the top 212 and the bottom 210 of the flow member 222. In each case, the flow divider 126 reduces the cross-sectional area of the flow pathway through the interior channel 236 in a central area thereof, urging gas flow toward the periphery of the interior channel 236 and thereby increasing the portion of the gas flowing outwardly as it enters the processing region 113 as compared to the gas flow where the divider is not present.

Figure 3:
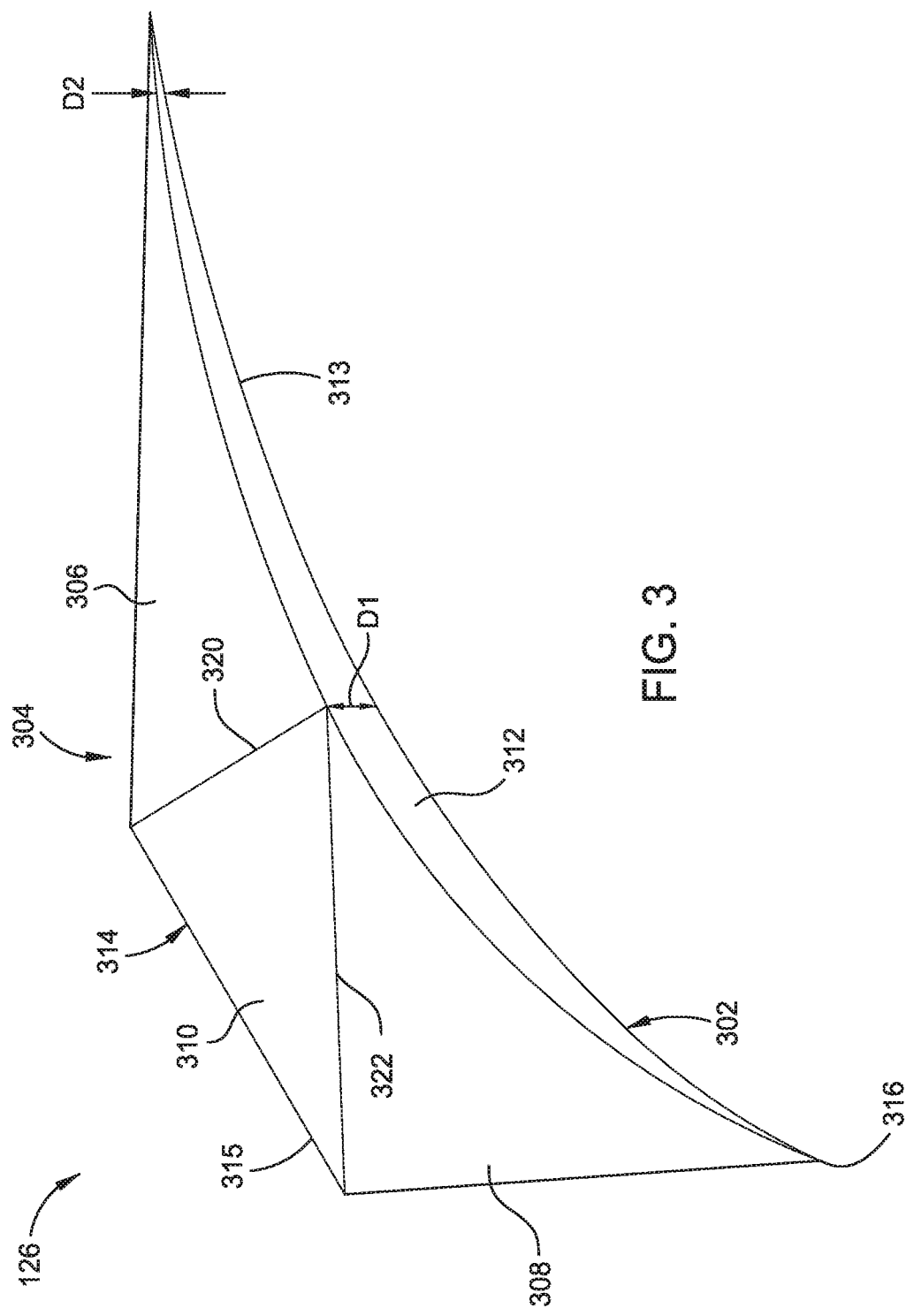
FIG. 3 is a perspective view of a flow divider, according to one or more embodiments described and discussed herein.

As seen in FIG. 3, in one or more embodiments, the flow divider 126 includes a flat surface 302, a contoured surface 304, a face 312 (e.g., curved face) at an outlet end 313, and an edge 315 at an inlet end 314. The flow divider 126 is disposed in the interior channel 236 with the flat surface 302 against either the top 212 or the bottom 210. As described above, in some cases, two flow dividers 126 can be used and can be disposed with their respective flat surfaces against each other. Here, the flow divider 126 is manufactured as a separate piece that is attached to the bottom 210 of the flow member 222, but in some cases the flow member 222 and the flow divider 126 can be formed (for example, molded or sculpted) as a single piece. In some of the embodiments depicted in FIGS. 2A-2D, the flow divider 126 extends from the outlet side 202 partway along the interior channel 236 to the inlet side 204. In other embodiments, the flow divider 126 can extend from the outlet side 202 all the way to the inlet side 204. The flow divider 126 has a shape that reduces the cross-sectional area of the flow pathway near the central area of the interior channel 236.

The top 304 of the flow divider 126 includes a first segment 306, a second segment 308, and a third segment 310, wherein each of the segments 306, 308, 310 has a generally triangular surface facing the gas flow. The flow divider 126 includes a first edge 320 where the third segment 310 meets the first segment 306 and a second edge 322 where the third segment 310 meets the second segment 308. In one or more embodiments, the first edge 320 and the second edge 322 extend as straight edges from the face 312 (e.g., curved face) at the gas flow outlet side of the flow divider 126 to the inlet end 314 at the gas flow inlet end thereof. In other embodiments, the first edge and the second edge are curved away from the third segment 310 and extend from the face 312 to the inlet end 314. In some embodiments, the first edge is different than the second edge. The third segment 310 has the shape of an equilateral triangle viewed top down. In other embodiments, the third segment 310 can have a diamond shape or a curvilinear triangular shape, or can be the shape of a polygon with some or all of the sides curved, for example a triangular shape with two straight sides and one curved side, the curved side being adjacent to the face 312. In still other embodiments, the third segment 310 can have more than three edges or sides, and may be, for example, trapezoidal, trapezium-shaped, asteroid-shaped, deltoid-shaped, or any other useful shape.

In one or more embodiments, the first segment 306 is not coplanar to the second segment 308 or the third segment 310. As shown in FIG. 3, the first and second segments 306 and 308 have flow facings faces that depart in the opposite direction, toward the flat surface 302, from a plane defined by the third segment 310. The divider 126 has three segments of which the third segment 310 tapers inwardly in the gas flow direction and rises from one plane to a second plane. In other embodiments, the first segment 306 and the second segment 308 can also be flat. In other embodiments, all the segments 306, 308, and 310 are curved.

The face 312 has a concave crescent profile. At the ends of the crescent, the flow divider 126 has ends 316 (e.g., sharply pointed ends). The face 312 has a first height D1 where the face 312 intersects the third segment 310. The height of the face 312 decreases toward the ends 316. At a point between the center of the face 312 and the ends 316, the face 312 has a second height D2 less than the height D1. The third segment 310 has an edge that coincides with the edge 315 of the flow divider 126 at the inlet end 314 thereof. At the inlet end 314, the flow divider 126 has a substantially constant thickness along the edge 315. The thickness of the flow divider 126 at the inlet end 314 is less than the height D1, such that the third segment 310 extends slightly away from the flat surface 302 in the flow direction (e.g., from the inlet end 314 to the outlet end 313). In one or more embodiments, the length of the face 312 is between $3/5$ and $4/5$ or between $3/4$ and $4/5$ of the total length of the outlet side 202 of the flow member 222 (FIG. 2A).

As process gases enter the flow assembly, the divider directs the gas towards the outer edges of the conduit. The divider alters the pressure gradient within the conduit to encourage a faster distribution than a natural response to pressure and concentration gradients can achieve. By changing the shape of the conduit, the divider guides more gas away from the center by directed flow. By varying the height and length of the divider, gas flow towards the substrate is directed towards the edge of the substrate providing for deposition uniformity and edge pull up.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A processing chamber, comprising:
   a chamber body, wherein the chamber body comprises a first side and a second side opposite the first side;
   a flow assembly disposed in the first side, wherein the flow assembly comprises:
     a conduit expanding laterally from an inlet to an outlet of a flow member; and
     a flow divider, wherein the flow divider comprises:
       an exit end having a face that is curved;
       an inlet end opposite the exit end;
       a contoured top comprising a first segment, a second segment, and a third segment, wherein the first segment is triangular shaped, the second segment is triangular shaped with a first curved edge, and the third segment is triangular shaped with a second curved edge; and
       a bottom; and
   a distributed pumping structure adjacent to the second side.

2. The processing chamber of claim 1, wherein the flow divider varies in height.

3. The processing chamber of claim 1, wherein the first side of the flow divider has a first length, the first side of the flow assembly has a second length, and wherein the first length is between $3/4$ and $4/5$ of the second length.

4. The processing chamber of claim 1, wherein the flow assembly comprises a recess.

5. A processing system, comprising:
   a precursor activator;
   a processing chamber coupled to the precursor activator, wherein the processing chamber comprises:
     a chamber body, wherein the chamber body comprises a first side and a second side opposite the first side;
     a flow assembly disposed in the first side, wherein the flow assembly comprises:
       a flow member having an inlet side, the flow member comprising:
         a recess;
         an inlet within the recess; and
         an outlet side opposite the inlet side, wherein the outlet side is curved and has an outlet;
       a flow divider, wherein the flow divider comprises:
         an exit end having a face that it curved to match the curvature of the outlet side of the flow member;

an inlet end opposite the exit end;
a contoured top comprising a first segment, a second segment, and a third segment, wherein the first segment is triangular shaped, the second segment is triangular shaped with a first curved edge, and the third segment is triangular shaped with a second curved edge; and
a bottom; and
a distributed pumping structure located in the substrate support portion adjacent to the second side.

6. The processing system of claim 5, wherein the flow member further comprises a conduit extending through the flow member from the inlet side to the outlet side and fluidly connecting the inlet with the outlet.

7. The processing system of claim 6, wherein the conduit expands laterally from the inlet to the outlet.

8. The processing system of claim 6, wherein the flow divider further comprises an expanding width that matches the conduit.

9. The processing system of claim 7, wherein the flow divider is disposed on the bottom of the body.

10. The processing system of claim 8, wherein the flow divider varies in height.

11. The processing system of claim 5, wherein the first side of the flow divider has a first length, the first side of the flow assembly has a second length, and wherein the first length is between 3/4 and 4/5 of the second length.

12. A flow assembly, comprising:
a flow member having
an inlet side, wherein the inlet side comprises:
a recess; and
an inlet within the recess; and
an outlet side opposite the inlet side, wherein the outlet side is curved and has an outlet;
a conduit disposed through the flow member from the inlet side to the outlet side fluidly connecting the inlet with the outlet, wherein the conduit expands laterally from the inlet to the outlet; and
a flow divider disposed within the conduit, wherein the flow divider comprises:
an outlet end having a face that is curved to match the curvature of the outlet side of the flow member;
an inlet end;
an expanding width that matches the conduit;
a contoured top comprising a triangular shaped first segment, a second segment, and a third segment, wherein the second segment is triangular shaped with a first curved edge, and wherein the third segment is triangular shaped with a second curved edge; and
a bottom.

13. The flow assembly of claim 12, wherein the first side of the flow divider has a first length, the first side of the flow assembly has a second length, and wherein the first length is between 3/4 and 4/5 of the second length.

* * * * *